(12) United States Patent
Cruz et al.

(10) Patent No.: US 7,295,484 B2
(45) Date of Patent: Nov. 13, 2007

(54) TEMPERATURE BASED DRAM REFRESH

(75) Inventors: Arnaldo R. Cruz, Austin, TX (US); Qadeer A. Qureshi, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/685,419

(22) Filed: Mar. 13, 2007

(65) Prior Publication Data

US 2007/0153606 A1 Jul. 5, 2007

Related U.S. Application Data

(63) Continuation of application No. 11/000,560, filed on Dec. 1, 2004, now Pat. No. 7,206,244.

(51) Int. Cl.
*G11C 7/00* (2006.01)
*G11C 7/04* (2006.01)
*G11C 5/06* (2006.01)

(52) U.S. Cl. ................ 365/222; 365/211; 365/63

(58) Field of Classification Search ............ 365/222, 365/211
See application file for complete search history.

(56) References Cited

U.S. PATENT DOCUMENTS

| | | | | |
|---|---|---|---|---|
| 4,716,551 A | * | 12/1987 | Inagaki ................... | 365/222 |
| 5,278,796 A | * | 1/1994 | Tillinghast et al. ........ | 365/211 |
| 5,532,968 A | | 7/1996 | Lee | |
| 6,438,057 B1 | | 8/2002 | Ruckerbauer | |
| 6,557,072 B2 | | 4/2003 | Osborn | |
| 2002/0051396 A1 | * | 5/2002 | Higashiho et al. ......... | 365/222 |
| 2002/0136075 A1 | * | 9/2002 | Hsu et al. ................ | 365/222 |
| 2002/0191467 A1 | * | 12/2002 | Matsumoto et al. ........ | 365/222 |
| 2003/0058016 A1 | * | 3/2003 | Mizugaki ................. | 327/200 |
| 2003/0081484 A1 | * | 5/2003 | Kobayashi et al. ......... | 365/222 |
| 2004/0071191 A1 | | 4/2004 | Sim et al. | |
| 2004/0179416 A1 | | 9/2004 | Ikeda et al. | |
| 2004/0218458 A1 | | 11/2004 | Schneider et al. | |
| 2005/0030806 A1 | | 2/2005 | Perner | |
| 2005/0063234 A1 | | 3/2005 | Sinha et al. | |
| 2005/0146965 A1 | | 7/2005 | Kim et al. | |
| 2005/0162962 A1 | * | 7/2005 | Shirota et al. ............. | 365/222 |
| 2005/0201174 A1 | | 9/2005 | Klein | |
| 2007/0036015 A1 | * | 2/2007 | Sako ...................... | 365/211 |
| 2007/0153607 A1 | * | 7/2007 | Shirota et al. ............. | 365/222 |

FOREIGN PATENT DOCUMENTS

| | | | |
|---|---|---|---|
| JP | 63304499 A | | 12/1988 |
| JP | 2002343079 A | * | 11/2002 |

OTHER PUBLICATIONS

"DRAMs for Movbile Applicatiions, 512-Mbit DDR Mobile-RAM, Memory Products"; Preliminary Data Sheet; May 2004; pp. 1-53; V1.3; Infineon Technologies AG.
"Mobile-RAM, Speciality DRAMs"; Application Note; Feb. 2002; pp. 1-6; V 1.1; Infineon Technologies AG.

* cited by examiner

*Primary Examiner*—Lý Duy Pham
(74) *Attorney, Agent, or Firm*—David G. Dolezal

(57) ABSTRACT

A system for controlling the refresh cycles of a DRAM cell array based upon a temperature measurement. During active mode, a refresh request indication based on a measured temperature is provided to a DRAM controller (e.g. of another integrated circuit die), wherein the DRAM controller initiates a refresh cycle of the DRAM cell array in response thereto. In a self refreshing mode, the DRAM controller does not initiate refresh cycles, but refresh cycles are performed by a controller on the integrated circuit die of the array based upon a temperature measurement.

19 Claims, 2 Drawing Sheets

TEMPERATURE BASED DRAM REFRESH

CROSS-REFERENCE TO RELATED APPLICATIONS

This application is a Continuation of U.S. patent application Ser. No. 11/000,560, filed Dec. 1, 2004, now Pat. No. 7,206,244, the content of which is incorporated by reference in its entirety.

BACKGROUND OF THE INVENTION

1. Field of the Invention

This invention relates in general to memories and more specifically to refreshing DRAM cells based on temperature.

2. Description of the Related Art

A dynamic random access memory (DRAM) is a type of memory technology which stores data in cells. Each DRAM cell typically includes a capacitive element for storing charge indicative of the logical value stored in the cell. The charge stored in the capacitive element may leak over time. Accordingly, the memory cells of an array need to be refreshed. In one example of a refresh operation, a determination is made of whether a cell is storing a logical value corresponding to a high charge to be stored on the capacitive element or whether the cell is storing a logical value corresponding to a low charge (or no charge) to be stored on the capacitive element. If a high charge is to be stored, the refresh circuitry restores the full charge to the capacitor of the cell.

Refresh operations however, require time to perform the refresh cycle which prevents data from being written to or read from the DRAM array. Also, refresh cycles consume power.

What is desired is an improved system for refreshing a DRAM.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of a mode for carrying out the invention. The description is intended to be illustrative of the invention and should not be taken to be limiting.

Figure 1:
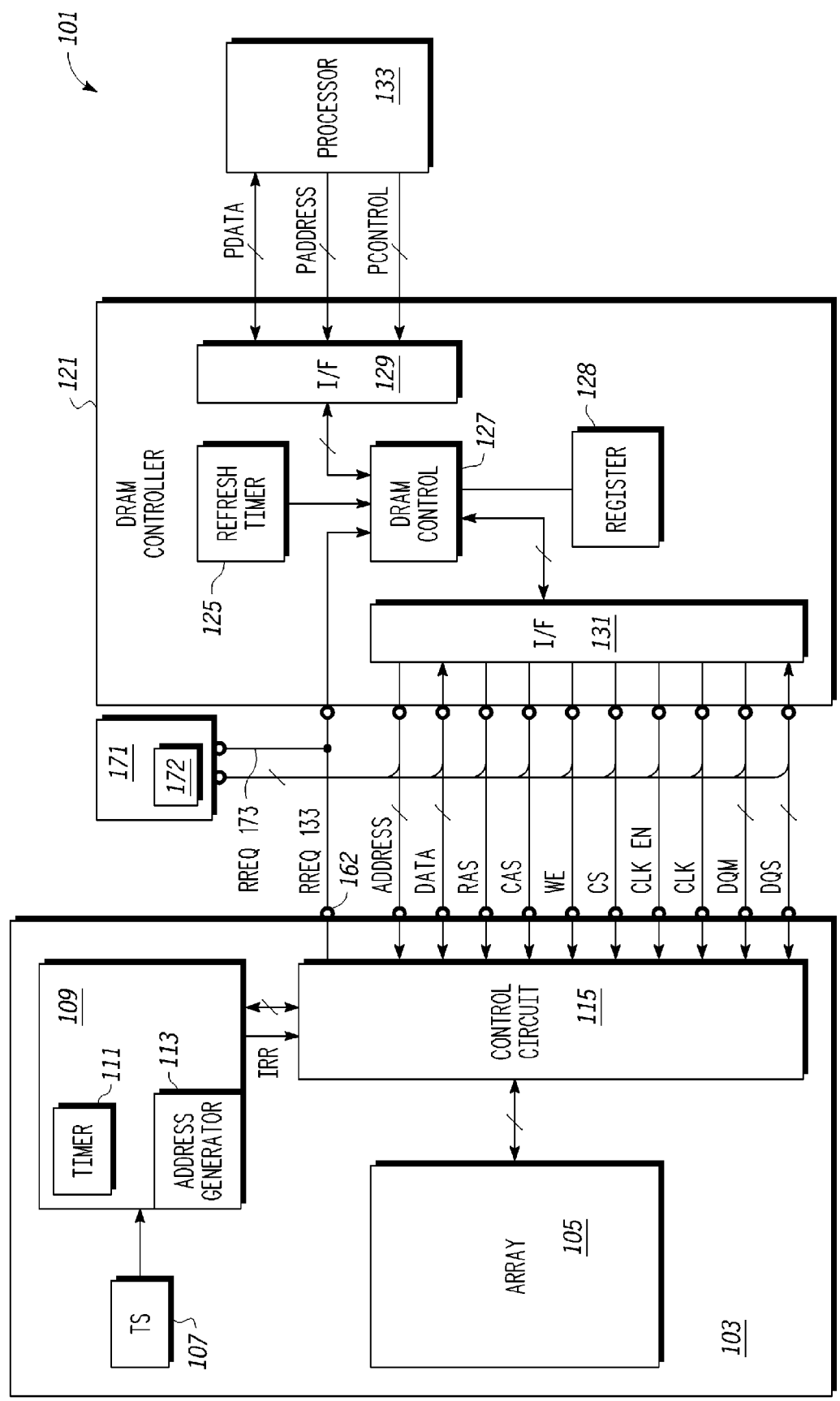
FIG. 1 is a block diagram of one embodiment of an electronic system according to the present invention.

FIG. 1 is a block diagram of an electronic system 101 that includes an integrated circuit die 103 with an array 105 of DRAM cells, an integrated circuit die 121 with a DRAM controller, and a processor 134. In one embodiment, system 101 is a computer system e.g. a personal computer, server, or laptop computer. In other embodiments, system 101 is a cellular phone. Still in other embodiments, system 101 may be an other type of electronic system e.g. a personal digital assistance (PDA), camcorder, or electronic camera.

Die 103 includes an array 105 of DRAM cells. In other embodiments, die 103 includes multiple arrays of DRAM cells. Die 103 includes a control circuit 115 that controls accesses to array 105 as well as other operations.

Die 103 includes a refresh controller 109. Refresh controller 109 includes a timer 111 and an address generator 113 (e.g. row address counter). Address generator 113 generates addresses for a refresh cycle of array 105. Refresh controller is coupled to a temperature sensor 107, also of die 103. In one embodiment, temperature sensor 107 provides a signal having a voltage indicative of a measured temperature. In one embodiment, temperature sensor 107 is a forward biased diode (not shown) but may be of an other type of temperature sensing device in other embodiments.

Refresh controller 109 utilizes the output of temperature sensor and timer 111 to generate an internal refresh request (IRR) signal to initiate a refresh cycle of array 105. In one embodiment, the rate at which the IRR signal is generated is based upon the temperature as measured by sensor 107.

The higher the temperature, the higher the leakage current of the capacitors of array 105, and thus, the greater the required rate of refresh. With lower temperatures, refresh cycles are needed less often to preserve data integrity. Accordingly, controller 109 generates the IRR to indicate a request to refresh at a higher rate when a higher temperature is measured and at a lower rate when a lower temperature is measured. In one embodiment, the IRR signal is generated at a rate that is linear with temperature. In other embodiments, a particular rate may be generated for a particular range of measured temperatures (e.g. as with a lookup table). In one example, the IRR signal may be generated at any one of 4 different rates.

In one embodiment where IRR signal is provided to indicate one of four rates based on temperature, controller 109 includes four comparators (not shown) with each having a different temperature set point. The outputs of the four comparators are used to select different taps in timer 111 to select different rates to provide the IRR signal. However, the IRR signal may be provided by different circuitry and/or by different methods in other embodiments.

The circuitry of die 103 may operate in at least one of two modes. In an active mode, array 105 is accessed (e.g. as with a data write or data read) to store data or retrieve data from array 105. These accesses are generated by the DRAM controller of die 121 and initiated by processor 134. Processor 134 initiates the data accesses to array 105 with the PDATA, PADDRESS, and PCONTROL signals provided to die 121.

DRAM control circuit 127 receives those signals via interface circuitry (I/F) 129. I/F circuitry 129 may includes buffers, transceivers, multiplexers, and/or other interface circuitry. In response to the commands from processor 134, DRAM control circuit 127 generates data accesses to array 105 by commands sent with signals (e.g. ADDRESS, DATA, RAS, CAS, CLK, WE, CLK_EN, DQM, DQS, and CS) provided to die 103 via I/F circuit 131. In response to those commands, control circuit 115 accesses the specified cells of array 105 and writes/reads values to or from those cells. In other embodiments, other types of address, data, and control signals may be utilized e.g. depending upon the type of DRAM memory being implemented and/or the type of addressing configurations being utilized. For example, some non DDR (double data rate) type DRAM memories would not utilize the DQS signal.

During the active mode, DRAM control circuit 127 initiates refresh cycles, which may be referred to in some embodiments as auto refresh cycles, e.g. by sending commands. In one embodiment, DRAM control circuit 127 sends an auto refresh command to control circuit 115 to initiate a refresh cycle. Control circuit 115 signals refresh controller 109 to generate addresses for the refresh cycle. Control circuit 115 may initiate a refresh cycle by other methods in other embodiments.

In the active mode, control circuit 115, in response to the IRR signal, will assert the refresh request signal (RREQ) on line 133 to control circuit 127 to request an initiation of a refresh cycle. In one embodiment, the RREQ signal is asserted by driving an output terminal of die 103 that is connected to line 133 to a voltage state indicative of a request to initiate a refresh cycle.

Figure 2:
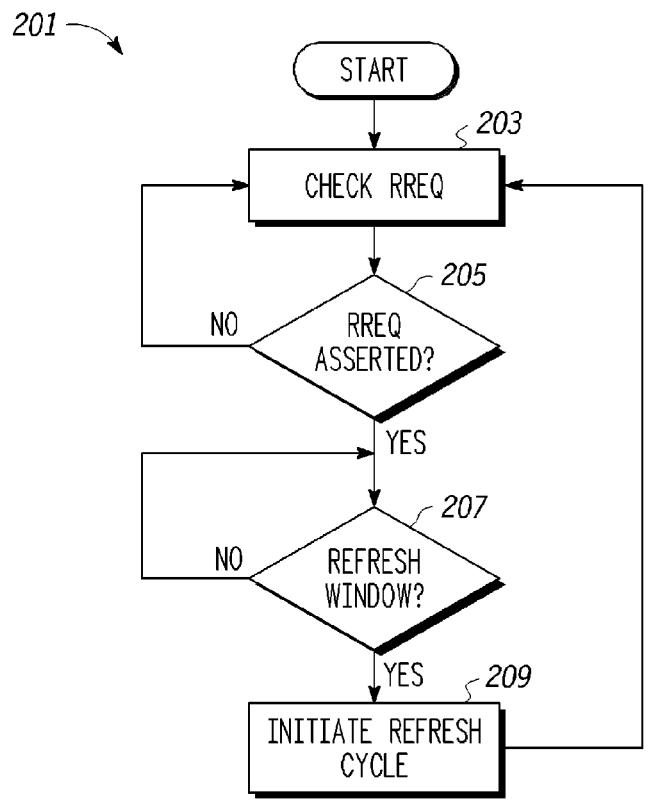
FIG. 2 is a flow diagram of an embodiment for operating a DRAM controller according to the present invention.

FIG. 2 is a flow diagram illustrating operations executed by control circuit 127 during an active mode. During the active mode, control circuit 127 checks the RREQ signal in operation 203. If the RREQ is detected as being asserted in operation 205, then in 207, control circuit 127 determines whether there is an opportunity (refresh window) to run a refresh cycle of array 105. In one embodiment, refresh cycles cannot be run when the processor has requested a read cycle or write cycle that is in progress. Accordingly, control circuit 127 waits until refresh window "opens" (e.g. the read or write cycle is completed) as determined in operation 207 before initiating a refresh cycle.

Because the IRR signal is generated based upon the measured temperature, the rate at which a refresh cycle is initiated by the RREQ signal to request a refresh cycle is based upon the measured temperature as well. Accordingly, the rate at which control circuit 127 initiates a request in the active mode is based upon the measured temperature.

Basing on temperature the rate at which refresh cycles are run in the active mode may enable a reduction in power consumed by system 101 in that for lower measured temperatures, refresh cycles are run less often (as per the temperature). Also, basing on temperature the rate at which refresh cycles are run also increases the data access times by the processor in that more data accesses may be run due to less refresh cycles.

When the circuitry of die 103 is placed in a self refresh mode, refresh cycles are initiated by the IRR signal at a rate based on the temperature as measured by sensor 107. Timer 111 provides a count in generating IRR. In the embodiment shown, control circuit 115 uses the IRR signal to refresh the cells of array 105. During the refresh cycle, address generator 113 provides the addresses for the refresh cycle.

During the self refresh mode, no data accesses by processor 134 (e.g. no data read accesses or data write accesses) are made to array 105. In one embodiment, no commands are sent to the circuitry of die 103 from DRAM control circuit 127 other than the exit refresh mode command.

Figure 3:
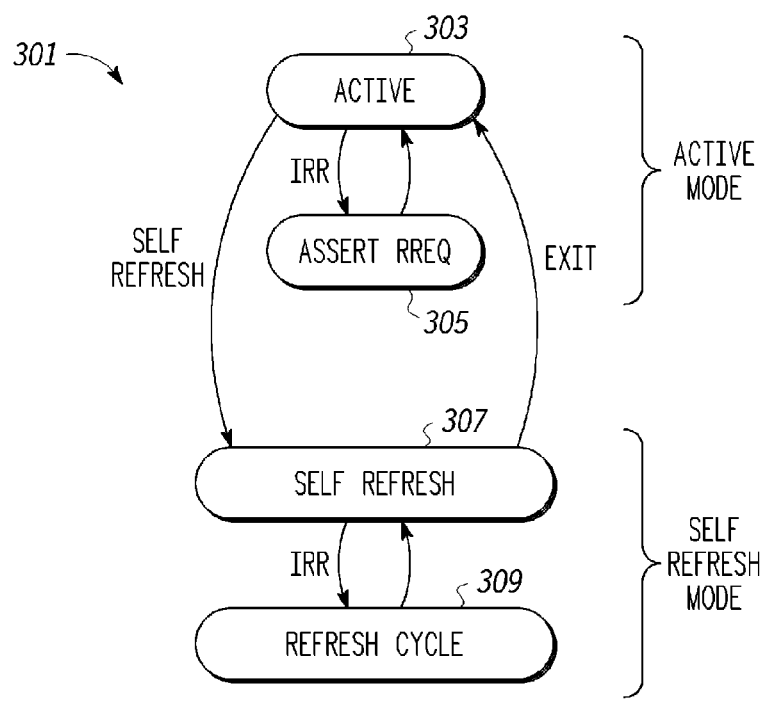
FIG. 3 is a state diagram showing one embodiment of an operation of a DRAM memory control circuit according to the present invention.

FIG. 3 is state diagram implemented by control circuit 115 for transitioning between the active mode and the refresh mode. States 303 and 305 are active mode states and states 307 and 309 are self refresh mode states. In an active state 303 where array 105 can be accessed for data read accesses and data write accesses, control circuit 115 will enter state 305 and assert the RREQ signal to DRAM controller of die 121 to initiate a refresh cycle in response to receiving the IRR signal from refresh controller 109. Upon asserting the RREQ signal, control circuit 115 transitions back to active state 303.

From the active state 303, control circuit 115 transitions to self refresh state 307 of the self refresh mode in response to a self refresh command sent by control circuit 127 via I/F circuit 131. In one embodiment, the self refresh command is sent by placing the control signals (e.g. RAS, CAS, WE, CS, ClK_EN) in particular states at prescribed times.

In the self refresh state 307, control circuit 115 transitions to state 309 and runs a refresh cycle in response to receiving the IRR signal. After the refresh cycle is complete, control circuit 115 returns to state 307.

Control circuit 115 returns to the active state 303 of the active mode in response to receiving an exit command from control circuit 127 via I/F circuit 131.

Referring back to FIG. 1, die 121 includes circuitry that programmably controls DRAM control circuit's 127 responsiveness to the RREQ signal. Control registers 128 may be programmed with a value that causes control circuit 127 to ignore the RREQ signal and initiate refresh cycles as per refresh timer 125. In some embodiments, control registers 128 may be programmed with a value to set the rate at which control circuit 127 initiates refresh cycles when the RREQ signal is ignored. This value of register 128 may be programmed during manufacture, initialization, or during operation of system 101 (by processor 134).

In one embodiment, die 103, die 121, and a die that includes processor 134 are implemented in separate IC packages and then coupled together e.g. via busses of a circuit board. In other embodiments, the die 103 and 121 may be implemented in a single IC package (e.g. along with the die including processor 134 in some embodiments). In other embodiments, some or all of the circuitry of die 121 may be integrated into die 103. Further, in some embodiments, the circuitry of die 103, die 121, and the die that includes processor 134 may be implemented in one die or in two die, or in more than three die.

Also in other embodiments, control circuit 127 may be coupled to multiple die (DRAM array die) similar to die 103, each of which includes one or more arrays of DRAM cells. In one embodiment, each of the ADDRESS, DATA, and the control signals would be conveyed on a bus coupled to the multiple DRAM array die. Referring back to FIG. 1, die 171 is similar to die 103 and includes an array 172 of DRAM cells. Die 171 also includes a timer, address generator, control circuit, and temperature sensor similar to the circuitry of die 103. Die 171 is coupled to lines conveying the DATA, ADDRESS and control signals (e.g. a bus).

In one embodiment, the RREQ signal from each DRAM array die would be wired ORed such that a RREQ signal from any one of the DRAM array die would initiate a refresh cycle of all of the arrays of all the DRAM array die. For example, line 173 that carries the RREQ signal provided by die 171 is wired ORed to line 133. In such an embodiment, each refresh timer (e.g. timer 111 of die 103) of each DRAM array die would be reset upon initiation of a refresh cycle. In one embodiment, the RREQ signal is a discrete signal provided by an open drain terminal 162 of die 103.

In another embodiment, die 121 would include an input for each RREQ signal from each DRAM array die. In another embodiment, the RREQ signal from each DRAM array die would be implemented as a unique digital value. For example, in such a system with seven DRAM array die, each DRAM array die would have an output with 3 external terminals for conveying an encoded RREQ signal.

Referring back to FIG. 1, controller 109 and control circuit 115 are shown as separate control circuits. However, at least some or all of the circuitry of controller 109 may be integrated with control circuit 115 in other embodiments.

Although, FIG. 1 shows lines connected between the terminals of die 103 and 121, other embodiments may include intervening circuitry for conveying signals between the die. Such intervening circuitry may include buffers, level shifters, inverters, encoders and/or multiplexers. Accordingly, a refresh request indication may be provided in one form by one die but received in another form by another die.

In one embodiment, an electronic system includes a first integrated circuit die. The first integrated circuit die includes an array of dynamic random access memory (DRAM) cells, a temperature sensor, and refresh circuitry. The refresh circuitry refreshes the DRAM cells of the array. The first integrated circuit die also includes an external output. The external output provides a refresh request indication. The refresh request indication is indicative of a request to execute a refresh cycle of the array based upon a measured temperature of the temperature sensor. The electronic system also includes a second integrated circuit die. The second integrated circuit die includes control circuitry and an input. The input is coupled to receive the refresh request indication. The control circuitry of the second integrated circuit die utilizes the received refresh request indication to initiate a refresh cycle of the array.

Another embodiment includes a method for refreshing DRAM cells. The method includes operating in an active mode. The method includes, in the active mode, sensing a temperature with a temperature sensor located on a same integrated circuit die as an array of dynamic random access memory (DRAM) cells and providing a first indication to initiate a refresh cycle to first control circuitry. The first indication is based on a temperature measured by the temperature sensor. The method also includes, in the active mode, providing a second indication by the first control circuitry to initiate a refresh cycle of the array based on the first indication and refreshing the array as per the second indication from the first control circuitry. The method also includes operating in a self refresh cycle mode. The method includes, in the self refresh cycle mode, sensing a temperature with the temperature sensor, initiating a refresh of the array by a second control circuitry based on a temperature measured by the temperature sensor, and refreshing the array as per the initiating.

In another embodiment, an integrated circuit die includes an array of dynamic random access memory (DRAM) cells, a temperature sensor, control circuitry, and refresh circuitry. The refresh circuitry refreshes the DRAM cells of the array. The integrated circuit die also includes an external output. The external output provides a refresh request indication. The refresh request indication is indicative of a request to execute a refresh cycle of the array based upon a measured temperature of the temperature sensor.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An electronic system comprising:
    a first integrated circuit die including:
        an array of dynamic random access memory (DRAM) cells;
        a temperature sensor;
        refresh circuitry, the refresh circuitry for refreshing the DRAM cells of the array;
        refresh determination circuitry operably coupled to the temperature sensor, the refresh determination circuitry for generating requests to initiate a refresh cycle to refresh the array based upon a measured temperature of the temperature sensor; and
        an external output, the external output providing a refresh request indication externally from the first integrated circuit die, wherein the refresh request indication is indicative of a request to execute the refresh cycle of the array based upon the measured temperature of the temperature sensor; and
    a second integrated circuit die including:
        an input, the input coupled to receive the refresh request indication; and
        control circuitry, wherein the control circuitry of the second integrated circuit die utilizes the received refresh request indication to initiate the refresh cycle of the array.

2. The electronic system of claim 1 wherein during a self refresh mode of operation, control circuitry of the first integrated circuit die initiates self refresh cycles of the array by the refresh circuitry.

3. The electronic system of claim 2 wherein during an active mode of operation, the first integrated circuit die provides the refresh request indication to indicate a request to execute a refresh cycle of the array, wherein the first integrated circuit die provides the refresh request indication to indicate a request to execute a refresh cycle of the array based upon a measured temperature of the temperature sensor.

4. The electronic system of claim 3 wherein during an active mode of operation, the second integrated circuit die provides data to the first integrated circuit die to be written in the array.

5. The electronic system of claim 1 wherein during a self refresh mode of operation, the first integrated circuit die does not provide the refresh request indication to request an execution of a refresh cycle.

6. The electronic system of claim 1 wherein the second integrated circuit die includes a programmable register, wherein the contents of the register are indicative of whether the control circuitry of the second integrated circuit die is responsive to the refresh request indication.

7. The electronic system of claim 1 wherein:
    the external output includes a terminal of the first integrated circuit die and the refresh request indication includes an assertion of a signal provided by the terminal.

8. The electronic system of claim 1 further comprising:
    a third integrated circuit die including:
        a second array of dynamic random access memory (DRAM) cells;
        a second temperature sensor;
        refresh circuitry, the refresh circuitry for refreshing the DRAM cells of the second array;
        a second external output, the second external output providing a second refresh request indication, wherein the second refresh request indication is indicative of a request to execute a refresh cycle of the second array based upon a measured temperature of the second temperature sensor.

9. The electronic system of claim 8 wherein the refresh request indication is carried on a first line and the second refresh request indication is carried on a second line, wherein the first line and the second line are hard wired together in a wired OR configuration.

10. An integrated circuit die including:
    an array of dynamic random access memory (DRAM) cells;

a temperature sensor;

control circuitry;

refresh circuitry, the refresh circuitry for refreshing DRAM cells of the array;

refresh determination circuitry operably coupled to the temperature sensor, the refresh determination circuitry for generating requests to initiate a refresh cycle to refresh the array based upon a measured temperature of the temperature sensor; and an external output, the external output providing a refresh request indication externally from the integrated circuit die, wherein the refresh request indication is indicative of a request to execute the refresh cycle of the array based upon the measured temperature of the temperature sensor.

11. The integrated circuit die of claim 10 further comprising:

a timer, wherein the refresh request indication is provided to indicate a refresh request based upon the timer.

12. The integrated circuit die of claim 10 wherein a rate of providing the refresh request indication to request a refresh request is based upon a measured temperature of the temperature sensor.

13. The integrated circuit die of claim 10 wherein the external output includes an external terminal, and wherein the refresh request indication includes a discrete signal asserted in a first state indicative of a request to execute a refresh cycle, the discrete signal having a second state indicative of no request to execute a refresh cycle.

14. The integrated circuit die of claim 10 wherein during a self refresh mode of operation, the control circuitry initiates self refresh cycles of the array by the refresh circuitry.

15. The integrated circuit die of claim 10 wherein during an active mode of operation, the external output provides the refresh request indication to indicate a request to execute a refresh cycle of the array, wherein the external output provides the refresh request indication to indicate a request to execute a refresh cycle of the array based upon a measured temperature of the temperature sensor.

16. The integrated circuit die of claim 15 wherein during a self refresh mode of operation, the external output does not provide the refresh request indication to request an execution of a refresh cycle.

17. The integrated circuit die of claim 15 wherein data read accesses and data write accesses can be made to the array during the active mode and data read accesses and data write accesses can not be made to the array during the self refresh mode.

18. The integrated circuit die of claim 15 wherein during the active mode, refresh cycles of the array are initiated by control circuitry located external to the die.

19. The electronic system of claim 3 wherein data read accesses and data write accesses can be made to the array during the active mode and data read accesses and data write accesses can not be made to the array during the self refresh mode.

* * * * *